(12) United States Patent
Pochayevets et al.

(10) Patent No.: US 7,206,730 B2
(45) Date of Patent: Apr. 17, 2007

(54) HDL PREPROCESSOR

(76) Inventors: Oleandr Pochayevets, Berckhauserstrasse 42, 90409 Nuernberg (DE); Johann Siegl, Georg-Simon-Ohm Fachhochschule, Kesslerplatz, 90489 Nuernberg (DE); Herbert Eichele, Georg-Simon-Ohm Fachhochschule, Kesslerplatz, 90489 Nuernberg (DE)

( * ) Notice: Subject to any disclaimer, the term of this patent is extended or adjusted under 35 U.S.C. 154(b) by 877 days.

(21) Appl. No.: 09/913,243

(22) PCT Filed: Apr. 11, 2001

(86) PCT No.: PCT/US01/11931

§ 371 (c)(1),
(2), (4) Date: Aug. 9, 2001

(87) PCT Pub. No.: WO02/084538

PCT Pub. Date: Oct. 24, 2002

(65) Prior Publication Data

US 2004/0019873 A1 Jan. 29, 2004

(51) Int. Cl.
*G06F 17/50* (2006.01)
*G06F 9/455* (2006.01)

(52) U.S. Cl. .............. 703/14; 703/22; 716/18; 717/136; 717/143

(58) Field of Classification Search .............. 703/14, 703/22, 25; 716/5, 18, 4; 717/136, 143
See application file for complete search history.

(56) References Cited

U.S. PATENT DOCUMENTS

| | | | | |
|---|---|---|---|---|
| 5,465,216 A * | 11/1995 | Rotem et al. | .............. | 716/5 |
| 5,841,663 A * | 11/1998 | Sharma et al. | .............. | 716/18 |
| 5,987,239 A * | 11/1999 | Kirsch | .............. | 716/1 |
| 5,995,736 A * | 11/1999 | Aleksic et al. | .............. | 716/18 |
| 6,058,263 A * | 5/2000 | Voth | .............. | 703/25 |
| 6,120,549 A | 9/2000 | Goslin et al. | .............. | 703/20 |
| 6,421,251 B1 * | 7/2002 | Lin | .............. | 361/788 |
| 6,477,683 B1 * | 11/2002 | Killian et al. | .............. | 716/1 |
| 6,539,520 B1 * | 3/2003 | Tiong et al. | .............. | 716/3 |
| 6,625,798 B1 * | 9/2003 | Ferreri et al. | .............. | 716/18 |
| 6,629,312 B1 * | 9/2003 | Gupta | .............. | 717/136 |
| 6,651,225 B1 * | 11/2003 | Lin et al. | .............. | 716/4 |
| 6,853,970 B1 * | 2/2005 | Gupta et al. | .............. | 703/20 |
| 6,862,563 B1 * | 3/2005 | Hakewill et al. | .............. | 703/14 |
| 7,020,854 B2 * | 3/2006 | Killian et al. | .............. | 716/1 |
| 7,035,781 B1 * | 4/2006 | Flake et al. | .............. | 703/14 |
| 2002/0032559 A1 * | 3/2002 | Hellestrand et al. | .......... | 703/22 |
| 2003/0033595 A1 * | 2/2003 | Takagi et al. | .............. | 717/143 |
| 2003/0046668 A1 * | 3/2003 | Bowen | .............. | 717/131 |
| 2003/0061580 A1 * | 3/2003 | Greaves | .............. | 716/4 |
| 2003/0216901 A1 * | 11/2003 | Schaumont et al. | .......... | 703/13 |
| 2005/0149898 A1 * | 7/2005 | Hakewill et al. | .............. | 716/18 |

FOREIGN PATENT DOCUMENTS

EP  0 834 823 A1  8/1997

OTHER PUBLICATIONS

Bergamaschi, Reinaldo, et al., "Coral—Automating the Design of Systems-On-Chip Using Cores," IEEE 2000 Custom Integrated Circuits Conference, pp. 109-112.

(Continued)

*Primary Examiner*—Thai Phan
(74) *Attorney, Agent, or Firm*—Klarquist Sparkman LLP

(57) ABSTRACT

The present invention describes a VHDL preprocessor. Configurable and flexible VHDL sources comprise statements that are replaceable by specific values dependent on design requirements.

41 Claims, 15 Drawing Sheets

OTHER PUBLICATIONS

Sezer, Sakir, & Yu, Xing, "VHDL Package GUI," School of Electrical & Electronic Engineering, Jun. 7, 2000, pp. May 1-May 5.

"The C Preprocessor", publ. Sep. 1998, by Stallman R.M. Internet citation, URL:http//gcc.gnu.org/onlinedocs/gcc-2.95.2/cpp.ps.gz, pp. 1-44.

"The Logic Description Generator", in Application Specific Array Processors, 1990. Proceedings of the International Conference on Princeton, NJ, USA Sep. 5-7, 1990, Los Angeles, CA, USA, IEEE Comput. Soc, US, publ. Sep. 9, 2005, by Gokhale MB; Kopser A; Lucas SP; Minnich RG, pp. 111-112.

"Synthesis of customised hardware from ADA", in Circuits and Systems, 1994, ISCAS '94., 1994 IEEE International Symposium on London, UK May 30-Jun. 2, 1994, New York, NY, USA, IEEE, US, publ. May 30, 1994, by Dossis MF; Noras JM; Porter GJ, pp. 229-232.

Syntax driven approach for RTL hardware synthesis of parallel programs, publ. Feb. 22, 1996, by Dossis MF, pp. 4/1-4/16.

* cited by examiner

Special statements included
To VHDL project files
(Top layer implemented in LISP subset)

VHDL hierarchy
preprocessing routine
(Medium layer implemented in LISP subset)

LISP subset
Runtime environment
(Low layer implemented in ANSI C)

Fig. 8

HDL PREPROCESSOR

FIELD OF THE INVENTION

The present invention relates to a preprocessor for code written in a hardware description language, preferably VHDL. In particular, the present invention relates to methods, apparatuses and systems for configuring projects and/or IP cores written in a hardware description language.

BACKGROUND OF THE INVENTION

Since digital computer consisting of digital circuits are available engineers were looking for an appropriate form to describe such digital circuits by means of computers. The aim was to simulate circuits and to test their function before the circuits were transferred into hardware. Such form is, for example, HDL (Hardware Description Language). The latest step in this respect is the development of VHDL (Very high speed integrated circuits Hardware Description Language). VHDL was standardized in IEEE 1076 in 1987, extended in 1993 (IEEE 1164), and further extended in 1999 in IEEE 1076.1, also known as VHDL-AMS (Analog and Mixed Signals). VHDL can be used for documentation, verification, and synthesis of large digital hardware designs. This is actually one of the key features of VHDL, since the same VHDL code can achieve all three of these goals, thus saving a lot of effort and reducing the introduction of errors between translating a specification into an implementation.

Usually a VHDL-Model consists of three parts: an entity, an architecture, and one or more configurations. Sometimes also packages are used and test benches must be written to test models.

An entity declaration in VHDL is a statement that defines the external specification of a circuit or sub-circuit. Using the information provided in an entity declaration (the port names and the data type and direction of each port), one has all the information needed to connect that portion of a circuit into other, higher-level circuits, or to design input stimulus for testing purposes. The actual operation of the circuit, however, is not included in the entity declaration.

A very simple example is a NAND gate as shown in FIG. 1. At the top of the example is a library clause (LIBRARY IEEE;) and a use clause (USE IEEE.std_logic_1164.ALL;). This gives the entity access to all names declared within package STD_LOGIC_1164 in the library IEEE. The entity declaration includes the name of the entity and a set of generic and port declarations. GENERICS are constants passed into components, usually counts or delays. The PORT statement allows to define system I/O. A port may correspond to a pin on a IC, an edge connector on a board, etc. The following are signal types which can be declared in the port statement:

| | |
|---|---|
| IN | Input to the system |
| OUT | Output from the system |
| INOUT | A bi-directional signal |
| BUFFER | A register attached to an output. (It is normally impossible to read an output, but a buffer allows this.) |

The generic in the shown example is defined with type time because it is a delay value of 5 ns, although it is possible to pass in any VHDL type.

The second part of a VHDL-model is the architecture declaration. Every entity declaration must be accompanied by at least one corresponding architecture in order to describe how the model operates. VHDL allows to create more than one alternate architecture for each entity. An architecture declaration consists of zero or more declarations (of items such as intermediate signals, components that will be referenced in the architecture, local functions and procedures and constants) followed by a begin statement and a series of concurrent statements. The name of the architecture body is just an arbitrary label selected by the user. Within an architecture all statements are concurrent. There are two commonly used approaches for an architecture description, structural and behavioral. FIG. 2 gives an example of how a complete system can be build hierarchically by combining structural and behavioral models.

A behavioral model is one which defines the behavior of a system, i.e., how a system acts. The used statements are PROCESS, WAIT, IF, CASE, FOR-LOOP. The NAND gate of FIG. 1 can be described in a behavioral model as follows:

```
architecture behavior of NAND is
begin
    c <= NOT (a AND b) after DELAY;
end behavior;
```

The architecture contains a concurrent signal assignment which describes the function of the design entity. The concurrent assignment executes, whenever one of the ports a or b changes its value. The order in which concurrent signals are written has no effect on their execution. The signal assignment from the example has a delay, that means that the signal on the left hand side is updated after the given delay.

As already mentioned, a structural model can be many levels deep, starting with primitive gates and building to describe a complete system. A RS-FlipFlop can be constructed from the simple NAND gate above, as can be seen in FIG. 3.

The FlipFlop is defined as two interconnected NAND instantiations. These are defined in separate VHDL code. This allows to use different levels in coding. For example, it would be possible to instantiate the RS-FF component to form a shift register. It is necessary that the ports in a component declaration match the ports in the entity declaration one for one. The names, order, mode and types of the ports to be used are defined in the component declaration. A component has to be declared only once within an architecture, but may be instanced several times (two times in this example).

In this example the component NAND has two inputs (a and b) and an output (c). There are two instances of the NAND component in this architecture. The first line of the component instantiation statement gives this instance a name, nand1, and specifies that it is an instance of the component NAND. The second line describes how the component is connected to the rest of the design using the port map clause. The port map clause specifies what signals of the design to connect to the interface of the component in the same order as they are listed in the component declaration. The interface is specified in order as a, b, and then c, so this instance connects r to a, qb to b, and q to c. The second instance, named nand2, connects q to a, s to b, and qb to c of a different instance of the same NAND component.

The next type of design unit available in VHDL is called a configuration declaration. A configuration can be thought of as being roughly analogous to a parts list for a design. It specifies which architectures are to be bound to which entities. This allows to have different architectures bound to an entity statement and to change how components are connected in a design description at the time of simulation or synthesis. Configurations are optional, the VHDL standard specifies a set of rules that provides a default configuration, e.g. if more than one architecture for an entity is provided, the last architecture compiled will take precedence and will be bound to the entity.

A so-called package is used to collect commonly used declarations for use globally among different design units. It is identified by the PACKAGE keyword and can consist of two parts, a package declaration and an optional package body. Packages allow convenient ways of defining functions and constants which are used in more than one VHDL programs. They can be thought of as being a common storage area. Items defined within a package can be made visible to any other design unit in the complete VHDL design. They also can be compiled into libraries for later use.

Packages act like an entity, i.e., they declare the interfaces to the functions and sub-programs found in the package body. Packages defining one or more deferred constants or containing declarations of sub-programs additionally require a package body. The relationship between a package and package body is similar to the relationship between an entity and its architecture. Like an architecture a package body must have the same name as its corresponding package declaration.

When modeling a circuit design, usually pre-designed models, for example VHDL models, available on the market are used (for example models for Fast Fourier Transform, Fast Cosine Transform etc.). These models are however predefined. This is to some extent disadvantageous as it is required that some characteristics can be flexibly configured, i.e., having variable parameters. The problem here is that a hardware description language project Jill (e.g., VHDL-project) contains hardly configurable modules, for example:

```
GENERIC (width)
    IF in_adr = "XX . . . X" THEN
        out_d <= "XXXXXXX . . . XXX"; -- cos(2*Pi*I), I=0 . . . n
--                <--- width --->
    ELSIF in_adr = "XX . . . X" THEN
        . . .
    END IF;
    . . .
```

There is thus a demand that modules are configurable or flexible, such as models of CPUs or FFTs (Fast Fourier Transform).

FIG. 4 shows two conventional methods, i.e., "standard solution 1" and "standard solution 2" for providing such a flexibility in configuration. Both standard ways of VHDL project configuration require some external generation program (for example C) that creates a data file or directly a VHDL file. The standard of VHDL includes native configuration facilities expressed via "GENERIC", "GENERATE" and "AGGREGATE" directives but these do not satisfy all configuration needs: most sophisticated parts of VHDL code are to be configured via external software that prepares text files to be imported into VHDL source through the "textio" package. This is inconvenient and inefficient.

SUMMARY OF THE INVENTION

Thus, it is the object of the present invention to provide a more simple and convenient way of flexibly configuring modules written in a hardware description language, for example under VHDL. This object is achieved with the features of the claims.

The present invention provides a preprocessor for configuring projects and IP cores written in a hardware description language, and preferably written in VHDL. The present invention is based on the general idea that a configurable and thus flexible hardware description language source code, for example a VHDL source code, is obtained by first adding to the source statements that are then evaluated during the preprocessing operation and substituted by specific values depending on the specifically required configuration. Thus, a plurality of different specific cores can be obtained dependent on the requirements, and all unnecessary components are cancelled. These included statements are preferably LISP statements. The statements are preferably included surrounded by back single quotas ("'") in order to allow an identification of such configurable statements. The statements are a general description or terms representing parameters that are allowable at the particular location of the statement in the source code (for example the statement 'wordwidth' being a general variable term for the range, e.g., 8 to 32 bits). In other words, the preprocessor according to the present invention scans the source code for statements included in back single quotas ("'"), evaluates said statements, and replaces said general statements by calculated specific values dependent on the particular requirements. Hence, a single configurable and thus flexible source can be used for different applications and is adapted for each specific application by the present preprocessor.

The use of LISP statements in the present (e.g., VHDL) preprocessor is advantageous for several reasons. First, LISP is capable of performing as a self-modified program via its artificial intelligent functions like (mapcar). This feature provides a convenient way of evaluating the statements included into the VHDL source. Second, a LISP statement returns a single value after evaluation of the included statement. This value is then inserted into the VHDL source like a substitution of an included statement so that the VHDL source in its general form is transferred into a specific VHDL source dependent on the required configuration. All possible outputs that might be issued during the evaluation of the LISP statement are redirected as a prefix of the returned value.

Preferably, a test sequence of the IP core obtained with the VHDL preprocessor according to the present invention is automatically generated.

The preprocessor according to the present invention can be loaded into and operated in a general purpose computer or a dedicated computer, either of which includes both a processor and a memory, and is not limited in practice on any one particular type of computer.

The preprocessor according to the present invention has the following advantages. The preprocessor solves all configuration needs of a Hardware Description Language project, no additional external generation programs are required. Having the proposed preprocessor principle included into existent packages (for example, VHDL packages) vital problems of code configuration with respect to flexibility will be solved. The present preprocessor can also be used as a generator of IP cores, which:

will be optimized having no redundant units and switchers;

will be compiled and mapped fast;

will hide all architectural scalability from the end user;

will have their particular test benches.

According to a first aspect of the present invention there is provided a method for configuring projects and/or IP cores written in a hardware description language, said method comprising the steps of:

providing source code of projects and/or IP cores to be configured;

including in said source code statements representing configurable parameters;

evaluating said included statements based on input data representing a specific configuration desired by a user for obtaining specific values for said configurable parameters based on said input data; and replacing said statements by said calculated specific values.

An advantage of the method according to the first aspect is that existing sources, for example VHDL sources, can be modified in order for obtaining flexible and configurable sources.

According to a second aspect of the present invention, there is provided a method for obtaining configured projects and/or IP cores written in a hardware description language as desired by a user based on flexibly configurable projects and/or IP cores, said flexibly configurable projects and/or IP cores comprising source code having statements representing configurable parameters, said method comprising the steps of:

evaluating said included statements based on input data representing a specific configuration for obtaining specific values for said configurable parameters based on said input data; and replacing said statements by said calculated specific values.

Preferably, the source code is written in Very High Speed Integrated Circuit Hardware Description Language (VHDL) source code. Preferably, said statements are LISP statements. According to a preferred embodiment, a test sequence of the specifically configured project and/or IP core is generated.

According to a third aspect of the present invention, there is provided an apparatus for configuring projects and/or IP cores written in a hardware description language, said apparatus comprising storage means for providing source code of projects and/or IP cores to be configured; means for including in said source code statements representing configurable parameters; evaluating means for evaluating said included statements based on input data representing a specific configuration desired by a user for obtaining specific values for said configurable parameters based on said input data; and computing means replacing said statements by said calculated specific values.

According to a fourth aspect of the present invention, there is provided an apparatus for obtaining configured projects and/or IP cores written in a hardware description language as desired by a user based on flexibly configurable projects and/or IP cores, said flexibly configurable projects and/or IP cores comprising source code having statements representing configurable parameters, said apparatus comprising valuating means for evaluating said included statements based on input data representing a specific configuration for obtaining specific values for said configurable parameters based on said input data; and computing means for replacing said statements by said calculated specific values.

According to a fifth aspect of the present invention, there is provided a system for configuring projects and/or IP cores written in a hardware description language, said system comprising a computer having a processor and a memory, said memory having stored therein a preprocessing program for (i) providing source code of projects and/or IP cores to be configured; (ii) including in said source code statements representing configurable parameters; (iii) evaluating said included statements based on input data representing a specific configuration desired by a user for obtaining specific values for said configurable parameters based on said input data; and (iv) replacing said statements by said calculated specific values.

According to a sixth aspect of the present invention, there is provided a system for obtaining configured projects and/or IP cores written in a hardware description language as desired by a user based on flexibly configurable projects and/or IP cores, said flexibly configurable projects and/or IP cores comprising source code having statements representing configurable parameters, said system comprising a computer having a processor and a memory, said memory having stored therein a preprocessing program for (i) evaluating said included statements based on input data representing a specific configuration for obtaining specific values for said configurable parameters based on said input data; and (ii) replacing said statements by said calculated specific values.

According to a seventh aspect of the present invention there is provided a computer program comprising program code means for performing all the steps of any one of the methods of the first or second aspect when said program is run on a computer.

BRIEF DESCRIPTION OF THE DRAWINGS

FIG. 8 shows the internal architecture of the VHDL preprocessor according to the present invention;

DETAILED DESCRIPTION OF PREFERRED EMBODIMENTS AND EXAMPLES

The internal architecture of the VHDL preprocessor according to the present invention is shown in FIG. 8. The internal architecture of the VHDL preprocessor according to the present invention comprises three layers that provide flexibility and portability for various computer platforms. The top layer is implemented in LISP subset and comprises special statements that are included to VHDL project files. The second layer, i.e., the medium layer is also implemented in LISP subset and comprises the VHDL hierarchy preprocessing routine. Finally, at the low layer that is implemented in ANSI C the LISP subset runtime environment is provided. The implemented LISP subset runtime environment is described later.

Figure 9:
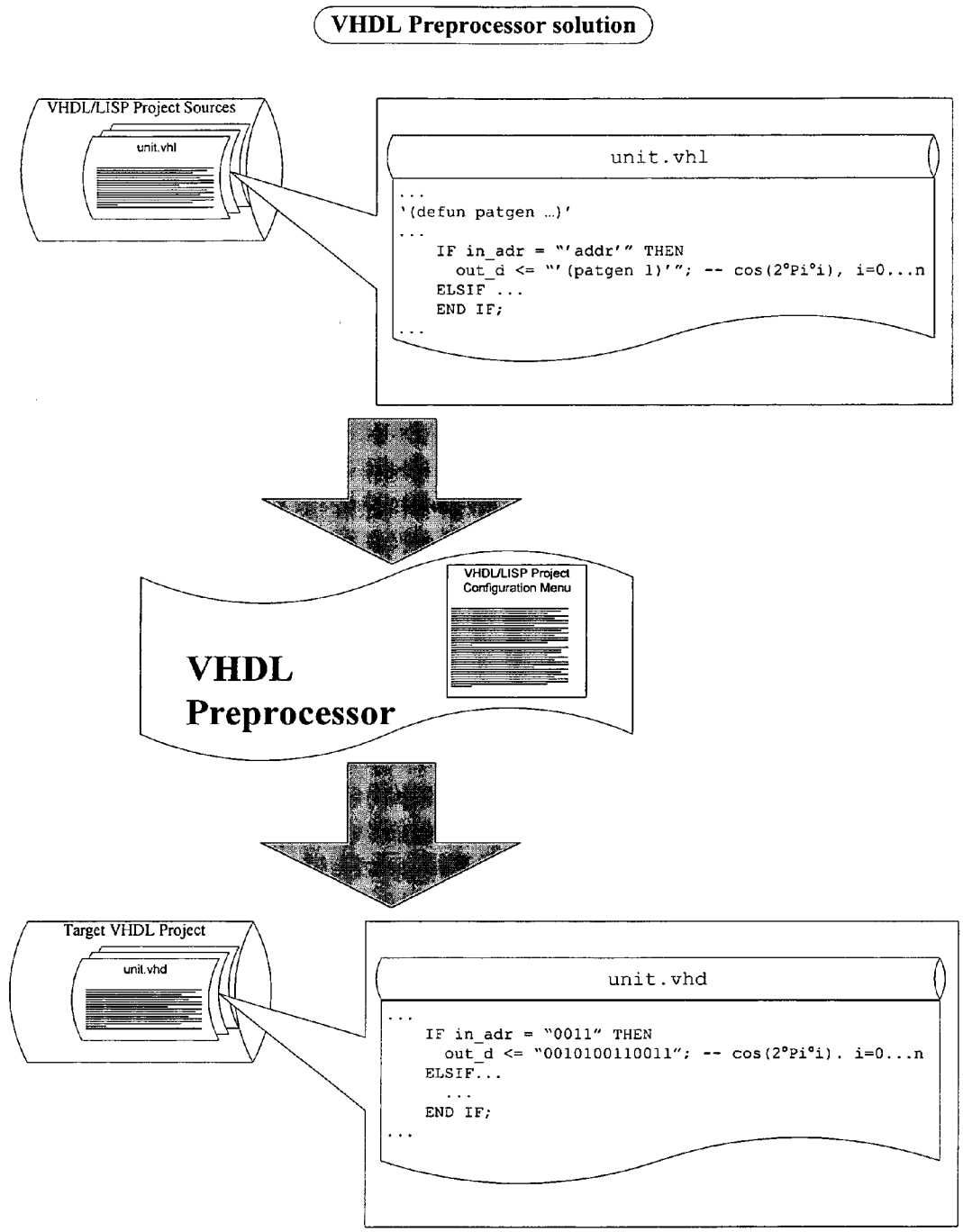
FIG. 9 shows the principle of the VHDL preprocessor according to the present invention.

FIG. 9 shows the principle of the VHDL preprocessor according to the present invention. Starting point are the VHDL/LISP project sources. "Source" represents the VHDL model including LISP statements, denoted in FIG. 9 with "unit.vhl". Every section that requires some modification is substituted by a LISP-like statement. Thereafter, the VHDL/LISP project sources are preprocessed using the present preprocessor. The parameters required for a specific configuration are input via a VHDL/LISP project configuration menu. Subsequently, all LISP entries in the target VHDL project (denoted with "unit.vhd") are evaluated.

Figure 7:
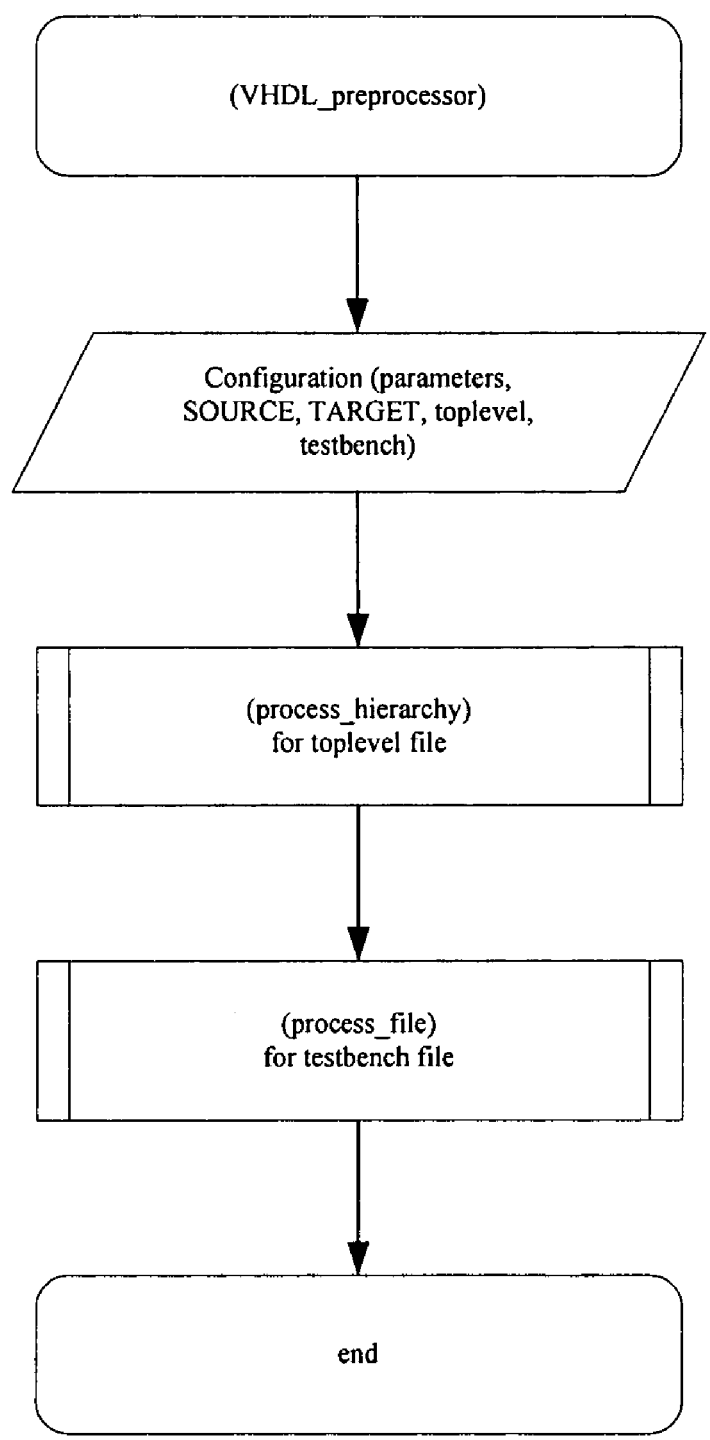
FIG. 7 is a flow diagram showing the main function (VHDL_preprocessor) according to the present invention.

FIG. 7 is a flow diagram showing the main function (VHDL_preprocessor) according to the present invention. Upon start of the main function (VHDL_preprocessor), the individual parameters, the location of the source, the destination of the target, the top level file and the test bench file are entered via an interactive menu. Subsequently, the function (process_hierarchy) is invoked for said top level VHDL file and the function (process_file) is invoked for said test bench file.

Figure 6:
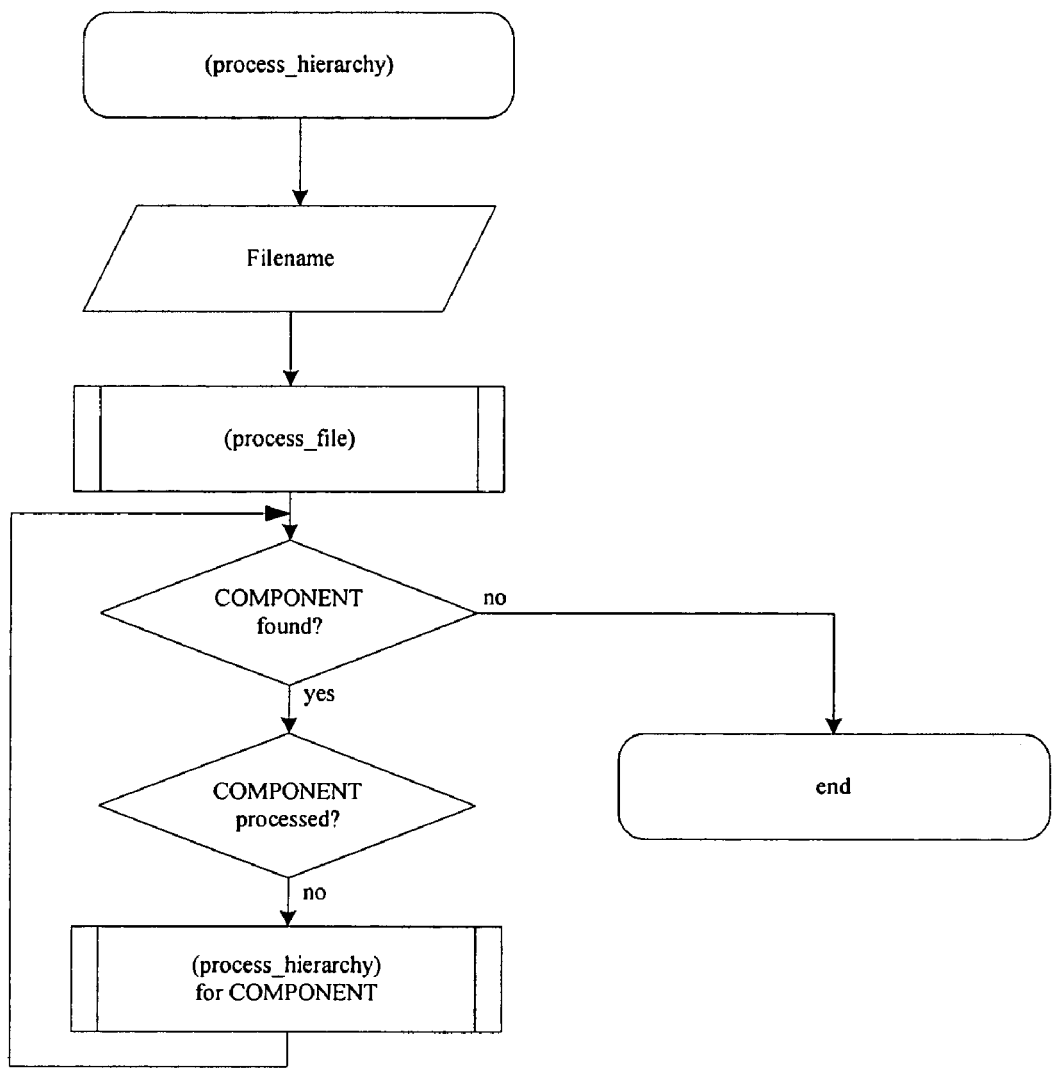
FIG. 6 is a flow diagram showing the function (process_hierarchy) according to the present invention.

As shown in the flow diagram of FIG. 6, the function (process_hierarchy) requests from the user a file name, and then invokes the function (process_file) for a VHDL file (PASS1). Thereafter it looks through the already preprocessed VHDL file and recursively invokes itself for all other VHDL files referenced in "COMPONENT" native VHDL directives (PASS2). Usually it starts from the top level of a hierarchy and it also can start from any level of a hierarchy with the purpose of interactive iterative debugging. Such a sequence of the preprocessing (PASS1, PASS2) is important for the automatic configuration of the hierarchy of the target project sources. During PASS1 after conditional processing in the LISP statements required "COMPONENT" directives will be inserted to the preprocessed VHDL file that will define how the function (process_hierarchy) will dive recursively during PASS2.

Figure 1:
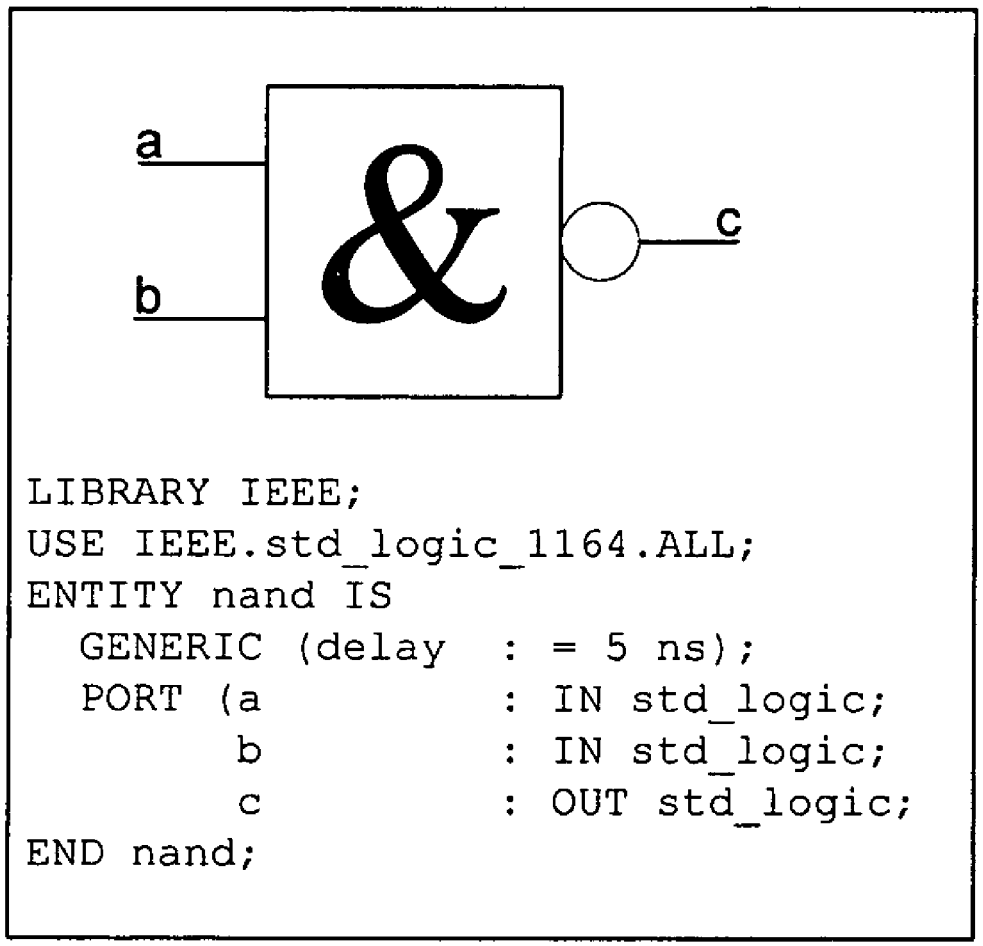
FIG. 1 shows the schematic and entity of a NAND gate.
Figure 2:
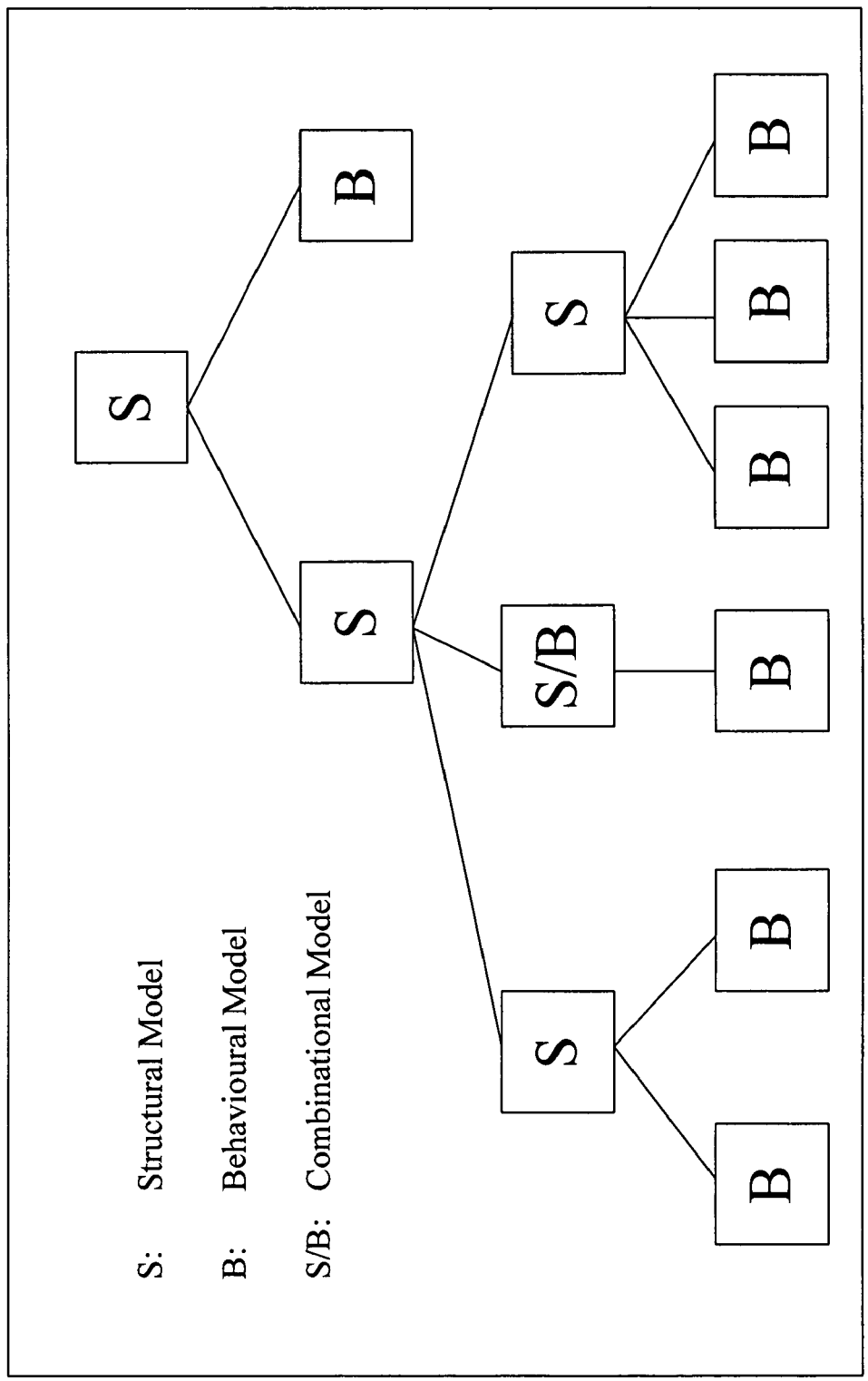
FIG. 2 shows an example of a hierarchical VHDL-model.
Figure 3:
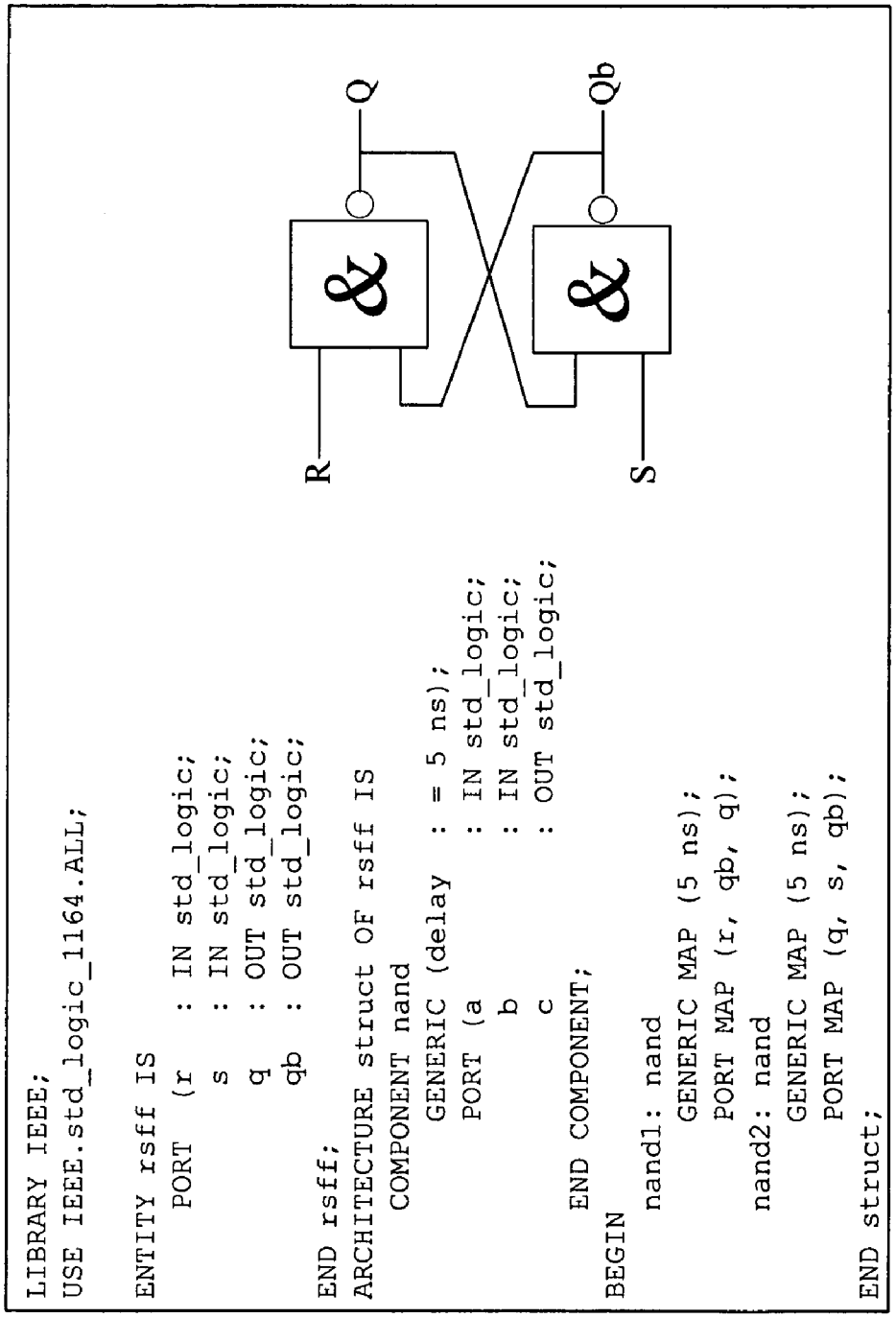
FIG. 3 shows a structural description of a RS-FlipFlop.
Figure 4:
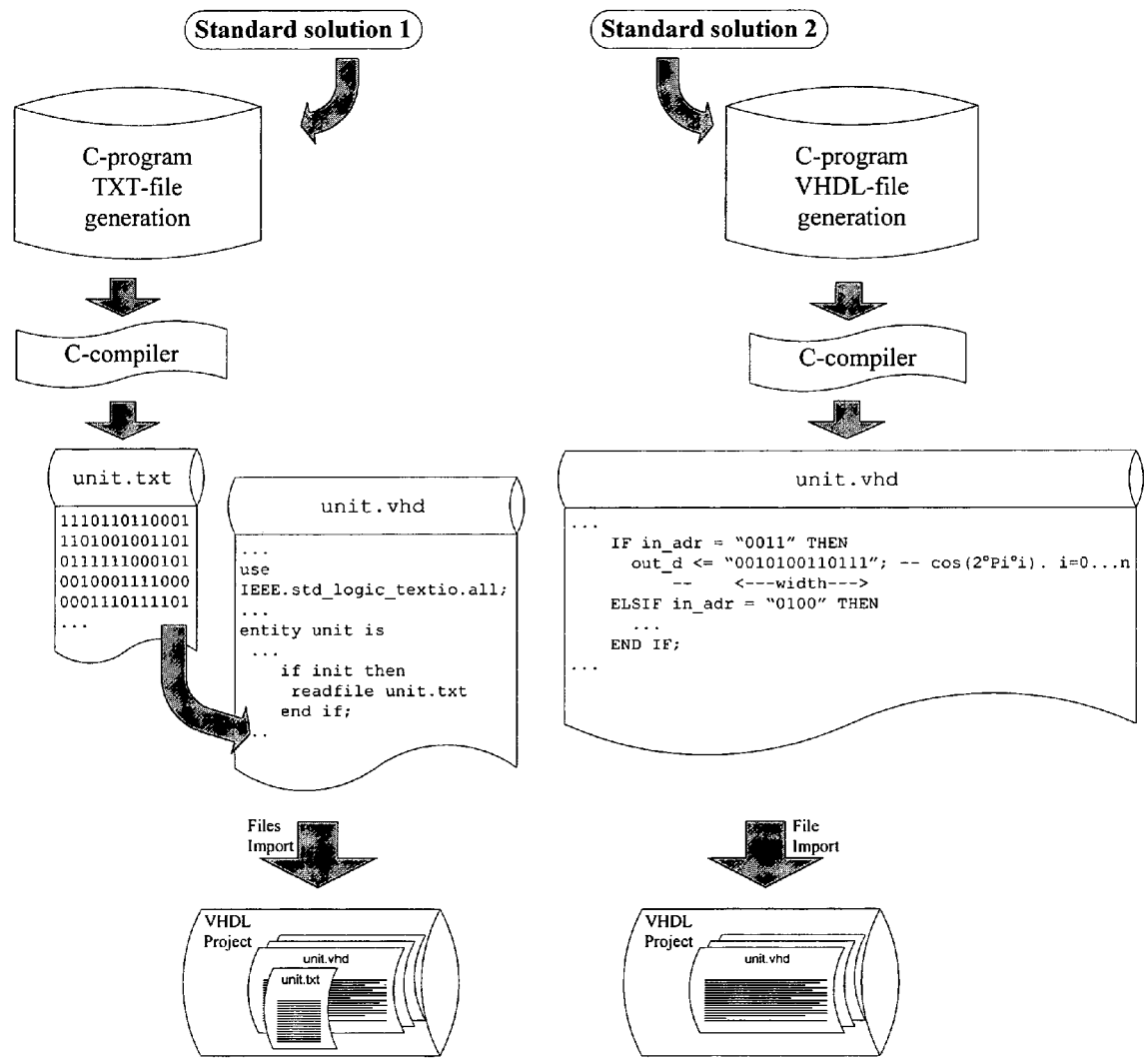
FIG. 4 shows two conventional methods of VHDL project configuration.
Figure 5:
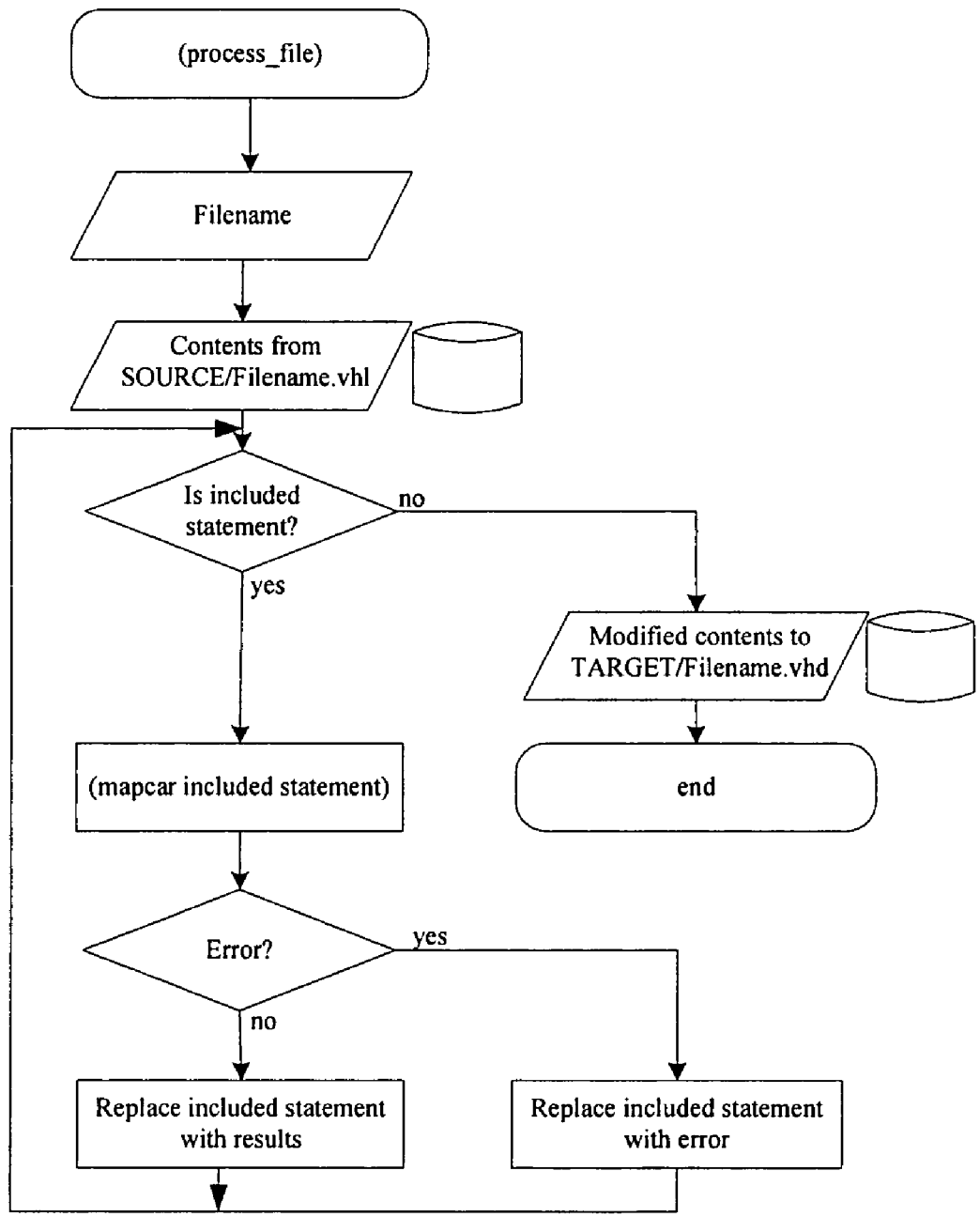
FIG. 5 is a flow diagram showing the function (process_file) according to the present invention.

The function (process_file) is shown in the flow diagram of FIG. 5. This function gets the contents of the file SOURCE/filename.vhl from the hard disk, checks it and substitutes in an iterative process all included LISP statements by their calculated values. However, in case an error occurs, the included LISP statement is replace with the error.

EXAMPLE 1

The following example shows the function of the VHDL preprocessor with reference to an 8-bit adder. First, the IP core sources and test bench sources are provided. The following statements describe a general model of an adder that can be flexibly configured depending on the specific demand.

```
-----------------------------------------------------------------------------------
-- device.vhl ==> device.vhd                                                     --
-----------------------------------------------------------------------------------
--                                                                               --
`(if use_rom
   (progn
        (outf "--              | a[2]            | b[2]              --\n" 0)
        (outf "--              |                 |                   --\n" 0)
        (outf "--      .---------+---------.   .---------+---------. --\n" 0)
        (outf "--      |    u0           |   |    u1           |   --\n" 0)
        (outf "--      |   const ROM     |   |   const ROM     |   --\n" 0)
        (outf "--      |                 |   |                 |   --\n" 0)
        (outf "--      '---------+---------'   '---------+---------' --\n" 0)
        (outf "--                |                 |                   --\n" 0)
        (outf "--                | opa[%02ld]" wordwidth)
        (outf "--                | opb[%02ld]                --\n" wordwidth)
        " "
   )
   (progn
        (outf "--                | a[%02ld]" wordwidth)
        (outf "--                | b]%02ld]                  --\n" wordwidth)
        " "
   )
)` --     |                 |                   --
--      .---------+-------------------+---------.                               --
--      |                             |                                         --
--      |            ADDER            |                                         --
--      |                             |                                         --
--      '-----------------+-----------------'                                   --
--                        |                                                     --
--                  | s[` (str_fmt "%02ld" wordwidth) `]                        --
--                                                                              --
```

```
----------------------------------------------------------------------------------------
-- Generation time: `(time)`                          --
----------------------------------------------------------------------------------------
LIBRARY IEEE;
USE IEEE.std_logic_1164.ALL;
USE IEEE.std_logic_signed.ALL;
USE IEEE.std_logic_arith.ALL;
ENTITY device IS
    PORT(a,b: IN STD_LOGIC_VECTOR(`(if use_rom 1 (-- wordwidth))` DOWNTO 0);
        s: OUT STD_LOGIC_VECTOR(`(-- wordwidth)` DOWNTO 0));
END device;
ARCHITECTURE str OF device IS
`(if use_rom
    (progn
        (outf "    COMPONENT rom\n" nil)
        (outf "    PORT(in_adr: IN STD_LOGIC_VECTOR(1 DOWNTO 0);\n" nil)
        (outf "        out_d: OUT STD_LOGIC_VECTOR(%ld DOWNTO 0));\n"
            (-- wordwidth))
        (outf "    END COMPONENT;\n" nil)
        (outf "    SIGNAL opa, opb: STD_LOGIC_VECTOR(%ld DOWNTO 0);\n"
            (-- wordwidth))
        " "
    )
    " "
) `BEGIN
`(if use_rom
    (progn
        (outf "    u0: rom\n" nil)
        (outf "        PORT MAP(in_adr => a, out_d => opa);\n" nil)
        (outf "    u1: rom\n" nil)
        "        PORT MAP(in_adr => b, out_d => opb);\n"
    )
    " "
) ` s <= `(if use_rom "op" " ")`a + `(if use_rom "op" " ")`b;
END str;
```

The ROM for the adder is described as follows:

```
--------------------------------------------------------------------------
-- rom.vhl ==> rom.vhd                                                 --
--------------------------------------------------------------------------
--                                                                     --
--                 .----------------------.                            --
-- in_adr[2]   |                          |   out_d[`(str_fmt "%02ld" wordwidth)`]  --
-- >-----------+        const ROM         +---------->                 --
--             |                          |                            --
--             '----------------------'                                --
--                                                                     --
--------------------------------------------------------------------------
-- Generation time: `(time)`                          --
--------------------------------------------------------------------------
LIBRARY IEEE;
USE IEEE.std_logic_1164.ALL;
USE IEEE.std_logic_signed.ALL;
USE IEEE.std_logic_arith.ALL;
ENTITY rom IS
    PORT(in_adr: IN STD_LOGIC_VECTOR(1 DOWNTO 0);
        out_d: OUT STD_LOGIC_VECTOR(`(-- wordwidth)` DOWNTO 0));
END rom;
ARCHITECTURE str OF rom IS
BEGIN
    run: PROCESS(in_adr)
    BEGIN
`(progn
    (defun coeff_gen
        (progn
            (setq wordwidth $1)
            (setq i $2)
            (setq n $3)
            (setq ret_line "\"0\"")
            (setq weight 0)
```

-continued

```
                (for j 2 1 wordwidth (progn
                    (setq weight (<< weight 1))
                    (setq weight (++ weight))
                ))
                (setq coeff (ival (*. weight (cos (/. (*. (pi) (++ (* 2 i))) (* 2
n))))))
                (setq j (<< 1 (- wordwidth 2)))
                (while (>= j 1) (progn
                    (setq ret_line (cat ret_line (if (> (/ coeff j) 0) "1" "0")))
                    (setq coeff (% coeff j))
                    (setq j (> > j 1))
                ))
                (cat (cat ret_line "\"; -- R") (cat (str i) (cat "(" (cat (str n)
                        ")"))))
            )
        )
        (outf "        IF in_adr = "00" THEN\n" 0)
        (outf "            out_d <= %s\n" (coeff_gen wordwidth 0 8))
        (outf "        ELSIF in_adr = "01" THEN\n" 0)
        (outf "            out_d <= %s\n" (coeff_gen wordwidth 1 8))
        (outf "        ELSIF in_adr = "10" THEN\n" 0)
        (outf "            out_d <= %s\n" (coeff_gen wordwidth 3 8))
        (outf "        ELSIF in_adr = "11" THEN\n" 0)
        (outf "            out_d <= %s\n" (coeff_gen wordwidth 2 8))
        "        END IF;\n"
    )`      END PROCESS run;
END str;
```

The simplest test bench script is described as follows:

```
# devtst.dl ==> devtst.do
radix dec
wave *
`(progn
    (if use_rom
        (setq weight 4)
        (progn
            (setq weight 0)
            (for i 2 1 wordwidth (progn
                (setq weight (<< weight 1))
                (setq weight (++ weight))
            ))
        )
    )
    (for i 1 1 10 (progn
        (outf "\nforce a %ld\n" (irnd weight))
        (outf "force b %ld\n" (irnd weight))
        (outf "run 1000\n" nil)
    ))
)`
""
# <EOF>
```

The present VHDL preprocessor assumes that configurable VHDL sources include special statements surrounded by back single quotas "`". These particular statements are evaluated during the preprocessing of the VHDL sources, and are substituted by their specific calculated values. For example, the statement '(if use_rom 1 (-- wordwidth))' used in the above IP core for an adder is replaced by "7" as shown in the following example of an 8-bit adder without ROMs. Statements that are not required for the specific application/configuration are canceled. In case a 8-bit version of the adder without ROMs is considered, the data as shown in the following are entered via a configuration menu by the user:

```
         VHDL PreProcessor (IP Core Generator)      !
*             Device IP Generator                   *
```

-continued

```
*             Configuration Menu                    *
    0.             Wordwidth: `8'
    1.             Use ROM: "No"
    2.             Source file directory: "SOURCE/"
    3.             Target file directory: "TARGET/"
    4.             TopLevel file: "device"
    5.             TestBench file: "devtst"
    G.    Generate the Device.
    Q.    Quit the program.
Enter choice: G
SOURCE/device ==> TARGET/device
SOURCE/devtst ==> TARGET/devtst
```

The final, i.e., generated IP core for the 8-bit version without ROMs has the following form:

```
-------------------------------------------------------------------
-- device.vhl ==> device.vhd                                     --
-------------------------------------------------------------------
--                                                               --
--            | a[08]           | b[08]                          --
--            |                 |                                --
--      .-----+-----------------+------.                         --
--      |                              |                         --
--      |            ADDER             |                         --
--      |                              |                         --
--      '--------------+---------------'                         --
--                     |                                         --
--                     | s[08]                                   --
--                                                               --
-------------------------------------------------------------------
-- Generation time:                                              --
-------------------------------------------------------------------
LIBRARY IEEE;
USE IEEE.std_logic_1164.ALL;
USE IEEE.std_logic_signed.ALL;
USE IEEE.std_logic_arith.ALL;
ENTITY device IS
    PORT(a,b: IN STD_LOGIC_VECTOR(7 DOWNTO 0);
          s: OUT STD_LOGIC_VECTOR(7 DOWNTO 0));
END device;
```

```
ARCHITECTURE str OF device IS
BEGIN
    s <= a + b;
END str;
```

The simplest test bench script is as follows:

```
# devtst.dl ==> devtst.do
radix dec
wave *
force a 65
force b 22
run 1000
force a 39
force b 67
run 1000
force a 120
force b 21
run 1000
force a 89
force b 28
run 1000
force a 62
force b 15
run 1000
force a 10
force b 49
run 1000
force a 35
force b 46
run 1000
force a 124
force b 67
run 1000
force a 97
force b 82
run 1000
force a 97
force b 99
run 1000
# <EOF>
```

EXAMPLE 2

Based on the same general model shown above, a specific model for a 32-bit version with ROMs can be obtained according to the VHDL-preprocessor of the present invention by entering the following parameters:

```
VHDL PreProcessor (IP Core Generator)    !
*          Device IP Generator           *
*          Configuration Menu            *
    0.    Wordwidth:          `32'
    1.    Use ROM:            "Yes"
    2.    Source file directory:  "SOURCE/"
    3.    Target file directory:  "TARGET/"
    4.    TopLevel file:      "device"
    5.    TestBench file:     "devtst"
    G.    Generate the Device.
    Q.    Quit the program.
Enter choice: G
SOURCE/device ==> TARGET/device
    SOURCE/rom ==> TARGET/rom
SOURCE/devtst ==> TARGET/devtst
```

The generated specific IP core for such a 32-bit adder then has the following form:

```
--------------------------------------------------------------------------------
-- device.vhl ==> device.vhd                                                  --
--------------------------------------------------------------------------------
--              | a[2]                   | b[2]                                --
--              |                        |                                     --
--       .------+------.         .------+------.                               --
--       |     u0      |         |     u1      |                               --
--       |  const ROM  |         |  const ROM  |                               --
--       |             |         |             |                               --
--       |             |         |             |                               --
--       '------+------'         '------+------'                               --
--              |                        |                                     --
--              | opa[32]                | opb[32]                             --
--              |                        |                                     --
--       .------+------------------------+------.                              --
--       |                                      |                              --
--       |              ADDER                   |                              --
--       |                                      |                              --
--       '------------------+-------------------'                              --
--                          |                                                  --
--                          | s[32]                                            --
--                          |                                                  --
--------------------------------------------------------------------------------
-- Generation time:                                                           --
--------------------------------------------------------------------------------
LIBRARY IEEE;
USE IEEE.std_logic_1164.ALL;
USE IEEE.std_logic_signed.ALL;
USE IEEE.std_logic_arith.ALL;
ENTITY device IS
    PORT(a,b: IN STD_LOGIC_VECTOR(1 DOWNTO 0);
         s: OUT STD_LOGIC_VECTOR(31 DOWNTO 0));
END device;
ARCHITECTURE str OF device IS
    COMPONENT rom
    PORT(in_adr: IN STD_LOGIC_VECTOR(1 DOWNTO 0);
         out_d: OUT STD_LOGIC_VECTOR(31 DOWNTO 0));
    END COMPONENT;
    SIGNAL opa, opb: STD_LOGIC_VECTOR(31 DOWNTO 0);
BEGIN
    u0: rom
        PORT MAP(in_adr => a, out_d => opa);
    u1: rom
        PORT MAP(in_adr => b, out_d => opb);
    s <= opa + opb;
END str;
```

The model of the associated ROMs is as follows:

```
--------------------------------------------------------------------------------
-- rom.vhl ==> rom.vhd                                                        --
--------------------------------------------------------------------------------
--                                                                            --
--                    .--------------------.                                  --
--   in_adr[2]        |                    |    out_d[32]                     --
--   >----------+     |     const ROM      +---------->                       --
--              |                          |                                  --
--              '--------------------------'                                  --
--                                                                            --
--------------------------------------------------------------------------------
-- Generation time:                                                           --
--------------------------------------------------------------------------------
LIBRARY IEEE;
USE IEEE.std_logic_1164.ALL;
USE IEEE.std_logic_signed.ALL;
USE IEEE.std_logic_arith.ALL;
ENTITY rom IS
    PORT(in_adr: IN STD_LOGIC_VECTOR(1 DOWNTO 0);
         out_d: OUT STD_LOGIC_VECTOR(31 DOWNTO 0));
END rom;
ARCHITECTURE str OF rom IS
BEGIN
    run: PROCESS(in_adr)
    BEGIN
        IF in_adr = "00" THEN
```

-continued

```
            out_d <= "011111011000101001011111100111110";   --
R0(8)
        ELSIF in_adr = "01" THEN
            out_d <= "011010100110110110011000101000011";   --
R1(8)
        ELSIF in_adr = "10" THEN
            out_d <= "00011000111110001011100000111100";   --
R3(8)
        ELSIF in_adr = "11" THEN
            out_d <= "010001110001110011101100011100110";  --
R2(8)
        END IF;
    END PROCESS run;
END str;
```

The simplest test bench script is as follows:

```
# devtst.dl ==> devtst.do
radix dec
wave *
force a 2
force b 0
run 1000
force a 1
force b 2
run 1000
force a 3
force b 0
run 1000
force a 2
force b 0
run 1000
force a 1
force b 0
run 1000
force a 0
force b 1
run 1000
force a 1
force b 1
run 1000
force a 3
force b 2
run 1000
force a 3
force b 2
run 1000
force a 3
force b 3
run 1000
# <EOF>
```

EXAMPLE 3

The following example shows the function of the inventive VHDL preprocessor as a generator of the Fast Cosine Transform (FCT) processor cores which can be customized via a configuration menu. The parameters of the configuration menu and examples of generated cores are enumerated below.

FCT word width: [2.32]bits

FCT size0: [2,4,8,16,32,64,128,256] points for the first dimension

FCT size1: [2,4,8,16,32,64,128,256] points for the second dimension

Dimensioning: 1D for one-dimensional or 2D for two-dimensional transform

Test number sequences: "Yes" to generate or "No" not to generate test set

| Processor | Clock[ns] | LCs[n(%)] | RAM [bit] | FPGA |
|---|---|---|---|---|
| 1D FCT 8bit 8 | 32 | 1971(16%) | 384 | ALTERA FLEX10K |
| 1D FCT 16bit 8 | 48 | 6113(50%) | 0 | ALTERA FLEX10K |
| 1D FCT 24bit 8 | 64 | 10311(84%) | 0 | ALTERA FLEX10K |
| 2D FCT 8bit 8x8 | 64 | 5508(45%) | 1024 | ALTERA FLEX10K |
| 2D FCT 10bit 8x8 | 64 | 7032(57%) | 1280 | ALTERA FLEX10K |
| 2D FCT 12bit 8x8 | 80 | 8761(72%) | 1536 | ALTERA FLEX10K |

Figure 10:
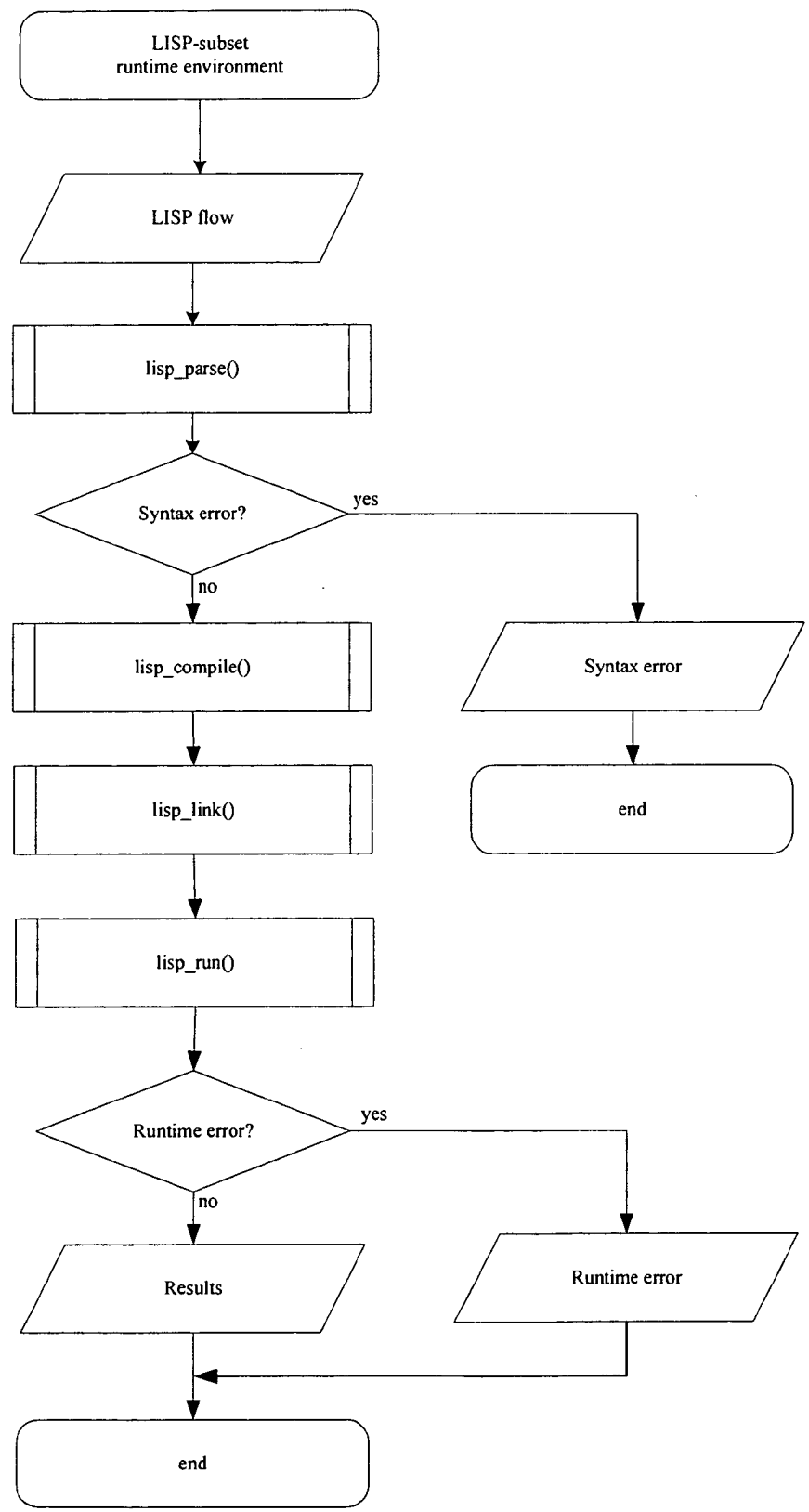
FIG. 10 is a flow diagram showing the LISP subset runtime environment implemented according to the present invention.

In comparison to standard LISP, the LISP subset runtime environment implemented in the present invention and shown in FIG. 10 has the following features:

Tiny size of the LISP kernel (120 KB for CISC (Intel Pentium processor), 330 KB for RISC (SPARC or MIPS processors)) due to minimal set of functions and optimized internal architecture.

Figure 11:
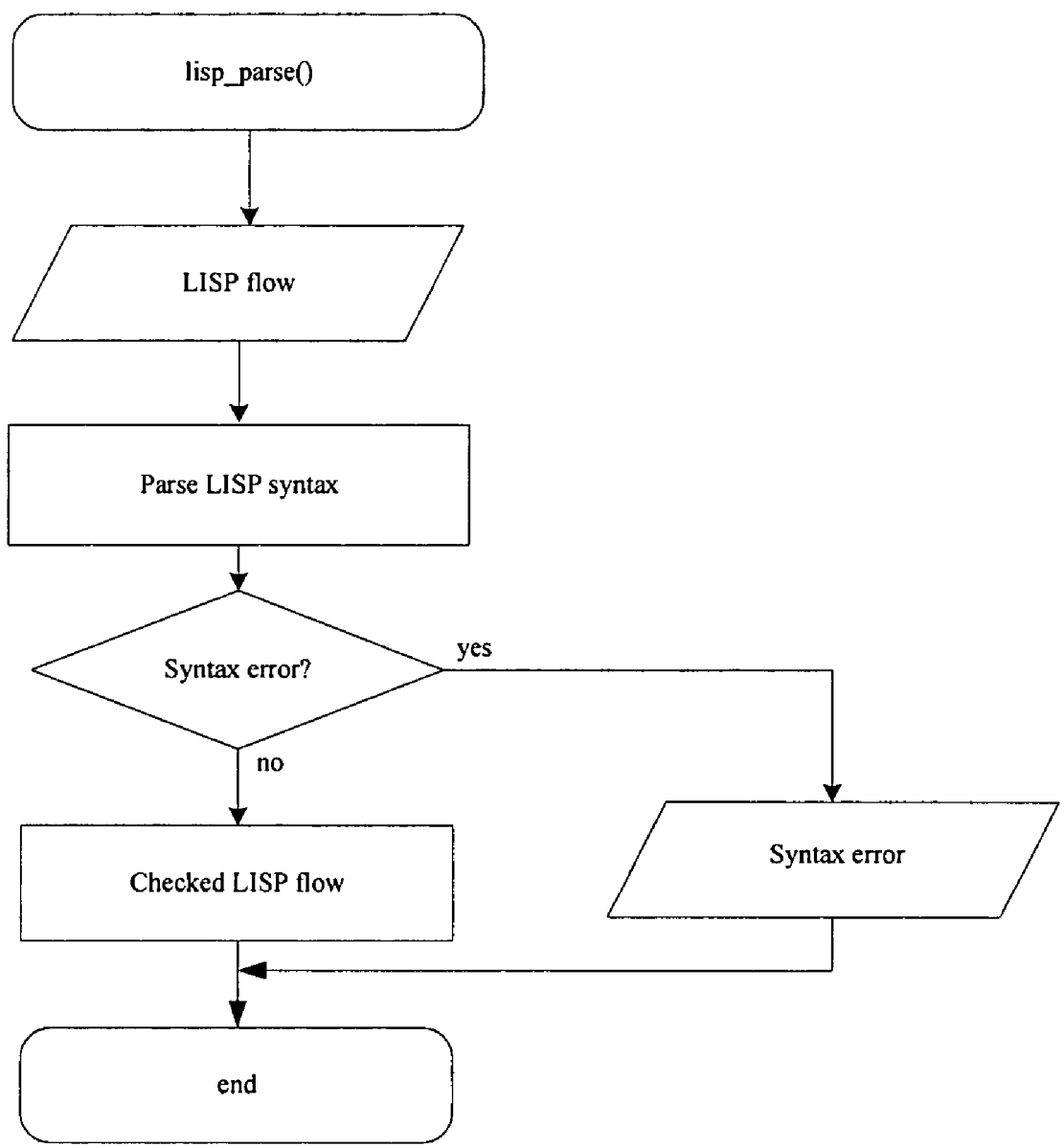
FIG. 11 is a flow diagram showing the function lisp_parse( ) according to the present invention.
Figure 12:
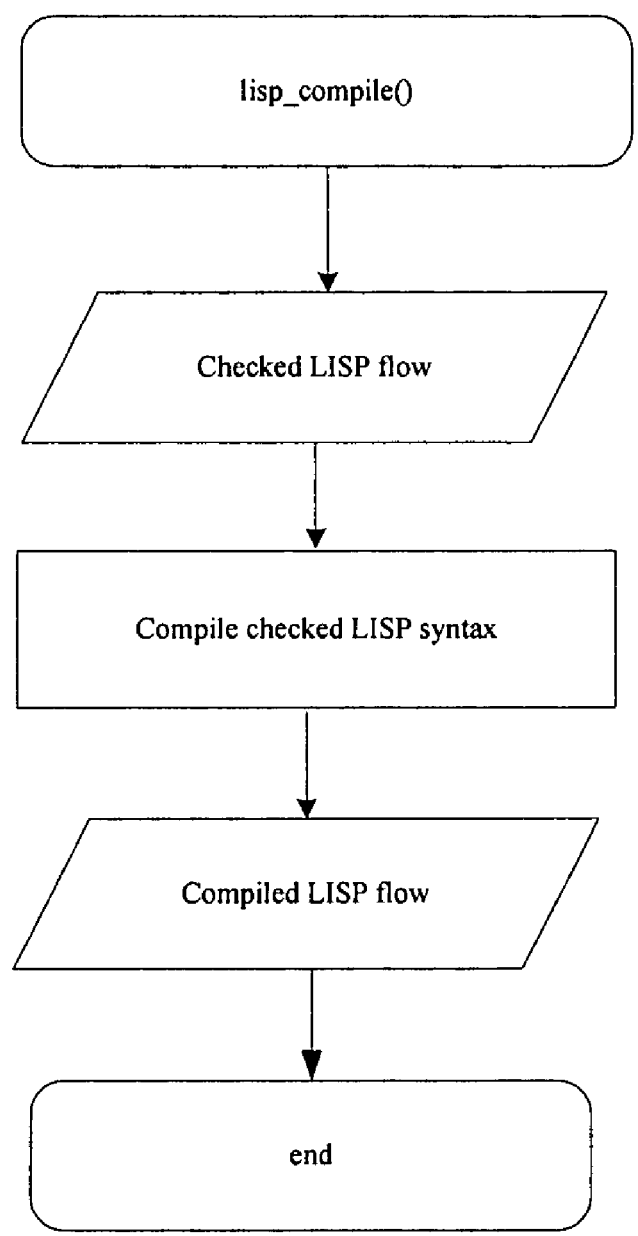
FIG. 12 is a flow diagram showing the function lisp_compile( ) according to the present invention.
Figure 13:
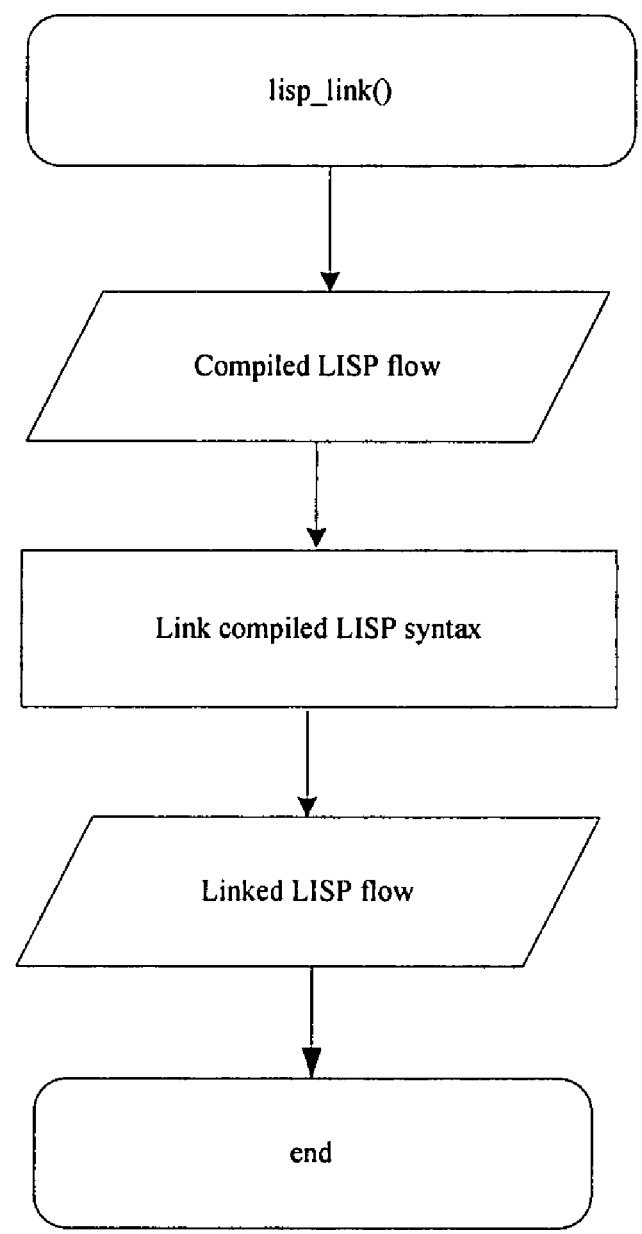
FIG. 13 is a flow diagram showing the function lisp_link( ) according to the present invention.
Figure 14:
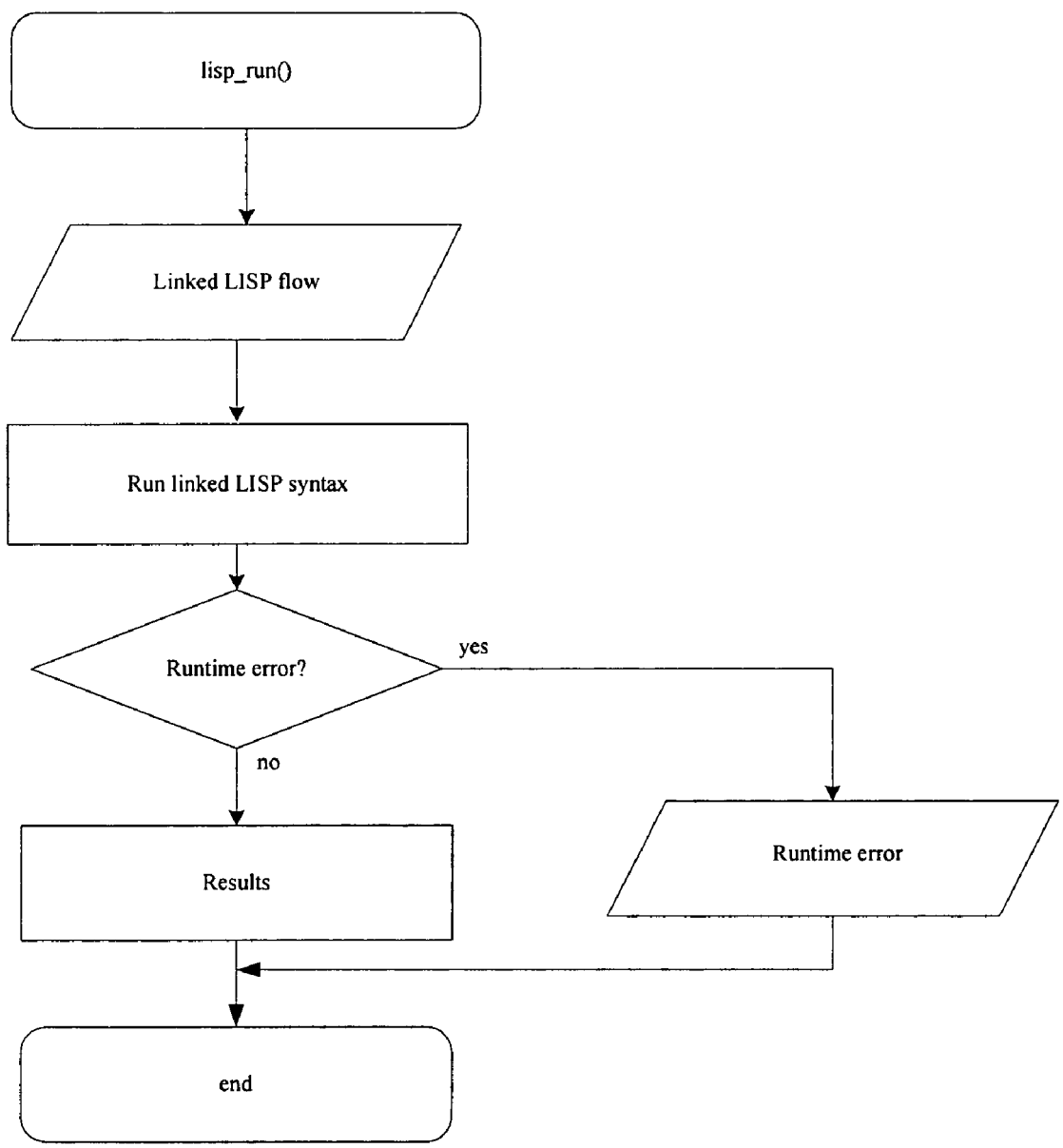
FIG. 14 is a flow diagram showing the function lisp_run( ) according to the present invention.

The LISP kernel can be easily embedded into other software systems like a CAD or a simulation suite due to separate functions lisp_parse( ) (see FIG. 11), lisp_compile( ) (see FIG. 12), lisp_link( ) (see FIG. 13), and lisp_run( ) (see FIG. 14).

Runtime standard output can be redirected as a result of evaluation.

The implemented LISP subset has the traditional prefix form and supports integer, float, string, list and tree data types. The following functions are chosen according to the invention as a minimal set:

| Category | Functions |
|---|---|
| Complex | (progn) |
| User Defined | (defun) |
| Variable/array creator/evaluator | (setq), (arsetq), (index) |

-continued

| Category | Functions |
|---|---|
| Input/output, file access | (accept), (scan_console), (outf), (file_create), (file_open), (file_write), (file_read), (file_close), (file_remove) |
| Conditional execution | (if) |
| Iteration execution | (while), (for) |
| Built-in comparison and logical | ("equal"/"=="), ("notequal"/"!="), ("less"/"<"), ("more"/">"), ("lessorequal"/"<="), ("moreorequal"/">="), ("and"/"&&"), ("or"/"\|\|"), ("not"/"!") |
| Built-in integer | (ival), (indices), (irnd), ("iadd"/"+"), ("isub"/"–"), ("imul"/"*"), ("idiv"/"/"), ("ima"/"*+"), ("imod"/"%"), ("iincr"/"++"), ("idecr"/"––"), ("ineg"/"0–"), (iabs), ("iand"/"&"), ("ior"/"\|"), ("ixor"/"^^"), ("inot"/"~"), ("ishr"/"> >"), ("ishl"/"< <") |
| Built-in float | (fval), (frnd), ("fadd"/"+."), ("fsub"/"–."), ("fmul"/"*."), ("fdiv"/"/."), ("fma"/"*+."), (fabs), ("fint"/"int"), ("fround"/"round"), ("fcos"/"cos"), ("fsin"/"sin"), ("fcas"/"cas"), ("fatn"/"atn"), ("fexp"/"exp"), ("fpow"/"pow"/"^."/"**"), ("fln"/"ln"), ("fsqrt"/"sqrt"/"sqr") |
| Built-in string | (str), (chr), (asc), (type), (dump_i2s), (dump_f2s), (dump_s2i), (dump_s2f), (notempty), (len), (at), (rat), (cat), (space), (replicate), (left), (leftr), (right), (rightl), (substr), (strtran), (str_raw), (str_unraw), (str_dump), (str_fmt), (ltrim), (rtrim), (alltrim), (pack), (head), (tail), (upper), (lower), (rev), (padl), (padr), (padc), (time), (getenv) |
| Built-in constant | (ee), (gamma), (phi), (pi), (prn_integer_fmt), (prn_float_fmt), (prn_string_fmt), (reinit_terminal), (term_type), (lines_term), (columns_term), (clrscr_term), (reverse_term), (blink_term), (bold_term), (normal_term), (hidecursor_term), (showcursor_term), (gotocursor_term), (gotocursor1_term), (version_fstlisp), (version_termcap), (version_strglib), (version_mempool), (compiled_on), (compiled_by) |
| Built-in artificial intelligence | (mapcar) |

Figure 15:
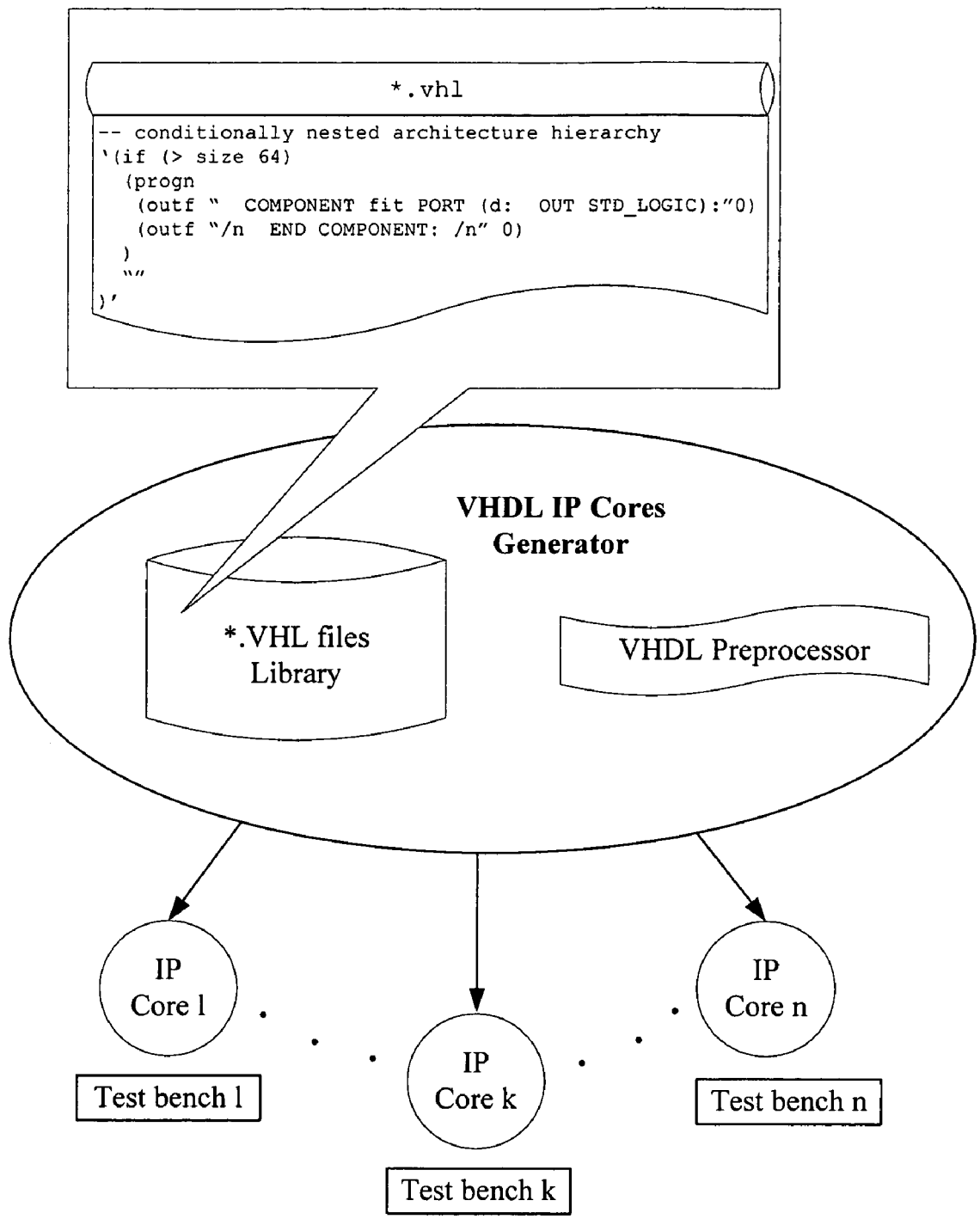
FIG. 15 is a schematic diagram showing the use of the VHDL preprocessor according to the invention for generating IP cores.

FIG. 15 is a schematic diagram showing the use of the VHDL preprocessor according to the invention for generating IP cores. The IP cores obtained by the present preprocessor are optimized having no redundant units and switchers, are prepared to be compiled and mapped fast, hide all architectural scalability from the end user and have their particular test benches.

The invention claimed is:

1. A method for configuring projects and/or IP cores written in a hardware description language, said method comprising:
   providing source code of projects and/or IP cores to be configured;
   including in said source code statements representing configurable parameters;
   evaluating said included statements based on input data representing a specific configuration desired by a user to obtain specific values for said configurable parameters based on said input data; and
   replacing said statements by said specific values.

2. The method of claim 1, wherein the source code is written in Very High Speed Integrated Circuit Hardware Description Language (VHDL) source code.

3. The method of claim 1, wherein said statements are LISP statements.

4. The method of claim 1, wherein said input data are input by a user.

5. The method of claim 1, further comprising generating a test sequence of the specifically configured project and/or IP core.

6. A method for obtaining configured projects and/or IP cores written in a hardware description language as desired by a user based on flexibly configurable projects and/or IP cores, said flexibly configurable projects and/or IP cores comprising source code having statements representing configurable parameters, said method comprising:
   evaluating said statements based on input data representing a specific configuration, said act of evaluating said statements comprising calculating specific values for said configurable parameters based on said input data; and
   replacing said statements by said calculated specific values.

7. The method claim 6, wherein the source code is written in Very High Speed Integrated Circuit Hardware Description Language (VHDL) source code.

8. The method of claim 6, wherein said statements are LISP statements.

9. The method of claim 6, wherein said input data are input by a user.

10. The method of claim 6, further comprising generating a test sequence of the specifically configured project and/or IP core.

11. An apparatus for configuring projects and/or IP cores written in a hardware description language, said apparatus comprising:
   storage means for providing source code of projects and/or IP cores to be configured;
   means for including in said source code statements representing configurable parameters;

evaluating means for evaluating said included statements based on input data representing a specific configuration desired by a user to obtain specific values for said configurable parameters based on said input data; and
computing means replacing said statements by said specific values.

12. The apparatus of claim 11, wherein the source code is written in Very High Speed Integrated Circuit Hardware Description Language (VHDL) source code.

13. The apparatus of claim 11, wherein said statements are LISP statements.

14. The apparatus of claim 11, wherein said input data are input by a user.

15. The apparatus of claim 11, further comprising generation means for generating a test sequence of the specifically configured project and/or IP core.

16. The apparatus of claim 11, further comprising generation means for automatically generating a test sequence of the specifically configured project and/or IP core.

17. An apparatus for obtaining configured projects and/or IP cores written in a hardware description language as desired by a user based on flexibly configurable projects and/or IP cores, said flexibly configurable projects and/or IP cores comprising source code having statements representing configurable parameters, said apparatus comprising:
evaluating means for evaluating said statements based on input data representing a specific configuration and for obtaining specific values for said configurable parameters based on said input data; and
computing means replacing said statements by said specific values.

18. The apparatus of claim 17, wherein the source code is written in Very High Speed Integrated Circuit Hardware Description Language (VHDL) source code.

19. The apparatus of claim 17, wherein said statements are LISP statements.

20. The apparatus of claim 17, wherein said input data are input by a user.

21. The apparatus of claim 17, further comprising generation means for generating a test sequence of the specifically configured project and/or IP core.

22. A system for configuring projects and/or IP cores written in a hardware description language, said system comprising a computer having a processor and a memory, said memory having stored therein a preprocessing program for (i) providing source code of projects and/or IP cores to be configured; (ii) including in said source code statements representing configurable parameters; (iii) evaluating said included statements based on input data representing a specific configuration desired by a user and obtaining parameter values for said configurable parameters based on said input data; and (iv) replacing each of said statements representing configurable parameters with the parameter value corresponding to the statement.

23. The system of claim 22, wherein the source code is written in Very High Speed Integrated Circuit Hardware Description Language (VHDL) source code.

24. The system of claim 22, wherein said statements are LISP statements.

25. The system of claim 22, wherein said input data are input by a user.

26. The system of claim 22, further comprising generating a test sequence of the specifically configured project and/or IP core.

27. A system for obtaining configured projects and/or IP cores written in a hardware description language as desired by a user based on flexibly configurable projects and/or IP cores, said flexibly configurable projects and/or IP cores comprising source code having statements representing configurable parameters, said system comprising a computer having a processor and a memory, said memory having stored therein a preprocessing program for (i) evaluating said statements based on input data representing a specific configuration to obtain specific values for said configurable parameters based on said input data; and (ii) replacing said statements by said specific values.

28. The system of claim 27, wherein the source code is written in Very High Speed Integrated Circuit Hardware Description Language (VHDL) source code.

29. The system of claim 27, wherein said statements are LISP statements.

30. The system of claim 27, wherein said input data are input by a user.

31. The system of claim 27, further comprising generating a test sequence of the specifically configured project and/or IP core.

32. An article of manufacture for configuring projects and/or IP cores written in a hardware description language, said article comprising:
a storage medium, the storage medium having stored thereon a plurality of instructions that, when executed by a machine, result in
providing source code of projects and/or IP cores to be configured;
including in said source code statements representing configurable parameters;
evaluating said included statements based on input data representing a specific configuration desired by a user and obtaining specific values for said configurable parameters based on said input data; and
replacing said statements by said specific values.

33. The article of claim 32, wherein the source code is written in Very High Speed Integrated Circuit Hardware Description Language (VHDL) source code.

34. The article of claim 32, wherein said statements are LISP statements.

35. The article of claim 32, wherein said input data are input by a user.

36. The article of claim 32, further comprising generating a test sequence of the specifically configured project and/or IP core.

37. An article of manufacture for obtaining configured projects and/or IP cores written in a hardware description language as desired by a user based on flexibly configurable projects and/or IP cores, said flexibly configurable projects and/or IP cores comprising source code having statements representing configurable parameters, said article comprising:
a storage medium, the storage medium having stored thereon a plurality of instructions that, when executed by a machine, result in
evaluating said statements based on input data representing a specific configuration and obtaining specific values for said configurable parameters based on said data input; and
replacing said statements by said specific values.

38. The article of claim 37, wherein the source code is written in Very High Speed Integrated Circuit Hardware Description Language (VHDL) source code.

39. The article of claim 37, wherein said statements are LISP statements.

40. The article of claim 37, wherein said input data are input by a user.

41. The article of claim 37, further comprising generating a test sequence of the specifically configured project and/or IP core.

* * * * *